United States Patent [19]

Hori et al.

[11] 4,361,949

[45] Dec. 7, 1982

[54] PROCESS FOR MAKING A MEMORY DEVICE

[75] Inventors: Ryoichi Hori, Tokyo; Masaharu Kubo, Hachioji; Norikazu Hashimoto, Tokorozawa; Shigeru Nishimatsu, Kokubunji; Kiyoo Itoh, Higashi-kurume, all of Japan

[73] Assignee: Hitachi, Ltd., Tokyo, Japan

[21] Appl. No.: 269,507

[22] Filed: Jun. 1, 1981

[51] Int. Cl.³ .......................................... H01L 21/22
[52] U.S. Cl. ................................. 29/571; 29/577 C; 148/187; 148/188
[58] Field of Search ............. 29/571, 577 C; 148/187, 148/188; 357/23 VT

[56] References Cited

U.S. PATENT DOCUMENTS

| | | | |
|---|---|---|---|
| 3,570,114 | 3/1971 | Bean et al. | 29/577 |
| 3,838,442 | 9/1974 | Humphreys | 29/578 X |
| 4,112,575 | 9/1978 | Fu et al. | 29/577 C |
| 4,160,987 | 7/1979 | Dennard et al. | 29/578 X |
| 4,183,040 | 1/1980 | Rideout | 357/45 X |
| 4,270,262 | 6/1981 | Hori et al. | 29/571 |

*Primary Examiner*—G. Ozaki
*Attorney, Agent, or Firm*—Antonelli, Terry & Wands

[57] ABSTRACT

A first semiconductor circuit element including a first electrode is formed on a semiconductor substrate, an insulating layer for insulating the first electrode is formed on the first electrode, and a first opening is provided in a part of this insulating layer.

Subsequently, a second semiconductor circuit element is formed by forming a second electrode overlaying in part the insulating layer at an area other than the first opening and, a subsidiary conductive layer is formed in the first opening. Another insulating layer is formed on the structure thus formed, whereupon second and third openings are respectively provided in this latter insulating layer.

First and second conductors are respectively deposited in the second and third openings, whereby electrical contact to the first and second electrodes are provided, with contact to the first electrode being via the subsidiary conductive layer.

25 Claims, 5 Drawing Figures

PROCESS FOR MAKING A MEMORY DEVICE

This is division of application Ser. No. 880,618, filed Feb. 23, 1978 now U.S. Pat. No. 4,270,262, and a division of application Ser. No. 225,268, filed Jan. 15, 1981.

FIELD OF THE INVENTION

This invention relates generally to a highly integrated semiconductor device, and a process for making the same. Specifically, it relates to a semiconductor device which comprises at least two semiconductor circuit elements formed in or on a semiconductor substrate and in which electrodes of the respective circuit elements form a multi-level structure, and a process for making the same. More concretely, it relates to a semiconductor memory which comprises memory elements each comprising a charge storage element made of a capacitor exploiting an inversion layer formed by the field effect and a field-effect transistor (FET) serving to control the transfer of charges into and from the capacitor, and a process for making the same.

BACKGROUND OF THE INVENTION

Semiconductor integrated circuits employing field-effect elements as the fundamental constituents have rapidly progressed in the aspects of integration scale and circuit performance owing to the development of the FET fabricating technique of the self-alignment type which uses, e.g., polycrystalline silicon for a gate electrode. In recent years, the technique of an integrated circuit having a two-level gate electrode in which a second gate electrode is placed over a first gate electrode has been developed, thereby further accelerating the degree of progress. By way of example, it is now possible to integrate a random access memory (RAM) of 16 K bits on a single silicon semiconductor wafer.

An example of the structure of such a memory is described in, "The Hi-C RAM Cell Concept" by A. F. Tasch, Jr., P. K. Chatterjee, H-S, Fu, and T. C. Holloway, published in Technical Digest of International Electron Devices Meeting in 1977, pp. 287–290. In the memory having the multi-level gate electrodes, inter-layer insulating layers are provided between the first and second gate electrodes and on the respective gate electrodes. Further, the respective openings are formed in the insulating layers on the respective gate electrodes, in which openings interconnection conductors are disposed so as to be connected with the gate electrodes. According to the prior art, these openings are simultaneously provided by etching, where the thicknesses of the insulating layers to be etched and removed are different for the respective openings. Accordingly, the openings formed have different sizes, with some openings being too large while other openings are too small. Moreover, it is difficult to control making the openings to be predetermined sizes. With the prior art, therefore, the fabrication is difficult. When it is intended to avoid such problems, the density of integration lowers.

The above problems apply, not only to a semiconductor device having FET elements of a multi-level gate structure, but also generally to a semiconductor device which has a plurality of semiconductor circuit elements in or on a semiconductor substrate and in which at least parts of electrodes of the respective circuit elements have a multi-level structure, as well as to a process for making the same.

SUMMARY OF THE INVENTION

It is accordingly an object of this invention to provide a semiconductor device which is highly integrated and which is easy to manufacture, and a process for making the same.

A further object of this invention is to provide a semiconductor device highly integrated and easy to manufacture which has at least two semiconductor circuit elements formed in or on a semiconductor substrate and in which at least parts of electrodes of the respective circuit elements have a multi-level structure, and a process for making the same.

A still further object of this invention is to provided a semiconductor memory device highly integrated and easy to manufacture, and a process for making the same.

In order to accomplish these and other objects, according to this invention, a first inter-layer insulating layer is formed on an underlying first electrode. This first inter-layer insulating layer is provided with an opening at a predetermined position at which an interconnection conductor and the first electrode are to be connected. A subsidiary interconnection conductive layer is buried into the opening. A second electrode is disposed in such a manner that at least a part of the second electrode overlies a part of the first inter-layer insulating layer except at the opening. A second inter-layer insulating layer is disposed on the second electrode. A third inter-layer insulating layer is disposed on the subsidiary interconnection conductive layer. The second and third inter-layer insulating layers are provided with openings, in which first and second interconnection conductors are respectively buried so as to connect the first interconnection conductor with the second electrode and to connect the second interconnection conductor with the first electrode through the subsidiary interconnection conductive layer.

DETAILED DESCRIPTION OF THE PRIOR ART

Figure 1:
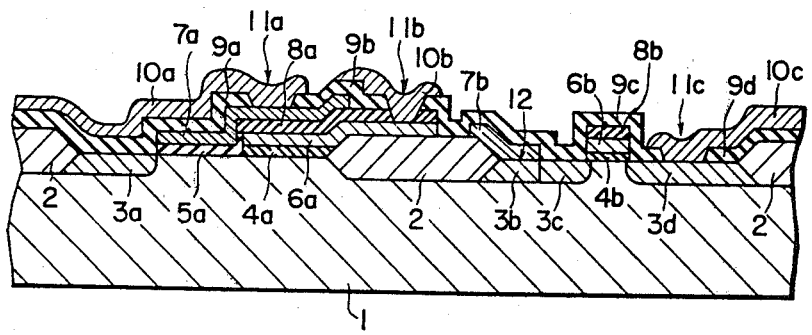
FIG. 1 is a sectional view of a prior art semiconductor device.

Referring now to the drawings, and in particular to FIG. 1 a sectional view of a prior art semiconductor memory is shown having a plurality of field isolating regions 2 formed in a substrate 1. In a region intervening between two of the field isolating regions 2, there are formed (1) a capacitor which consists of a first gate insulating layer 4a and a first gate electrode 6a, and (2) a field-effect switching element which consists of a second gate insulating layer 5a, a second gate electrode 7a and an impurity diffused layer 3a serving as a drain. In another region on the same substrate between the two of the field isolating regions 2, there is formed (3) a FET which consists of a third gate insulating layer 4b, a third gate electrode 6b, impurity diffused regions 3b, 3c serving as a source and a lead-out electrode 7b connected thereto by a contact portion 12, and an impurity diffused region 3d serving as a drain.

8a and 8b designate insulating layers overlying gate electrodes as are respectively disposed on the first and third gate electrodes 6a and 6b. Especially, the insulating layer 8a insulates the first and second gate electrodes 6a and 7a from each other. Shown at 10a, 10b and 10c are interconnection conductors, which are respectively connected with the second and first gate electrodes 7a, 6a, and the impurity diffused region 3d. Insulating layers 9a, 9b, 9c and 9d serve to insulate interconnection conductors 10a, 10b and 10c from the gate electrodes 7a, 6a and 6b, the impurity diffused regions 3a, 3b, 3c and the lead-out electrode 7b in areas other than contact portions 11a, 11b and 11c.

The capacitor constructed as described above forms an inversion layer based on the field effect in a semiconductor surface portion directly under the first gate insulating layer 4a, and stores charges therein. The field-effect switching element controls the transfer of charges between the drain 3a and the inversion layer under control of a voltage which is applied to the second gate electrode 7a. Thus, a memory cell which consists of the capacitor and the switching element is constructed.

The FET having the third gate electrode 6b is formed on the same substrate as that of the memory cell. It is for the purpose of illustrating one FET within a peripheral circuit for the memory cell.

In such a semiconductor memory, in order to connect the interconnection conductors 10a and 10b to the second and first gate electrodes 7a and 6b, respectively, the insulating layers 9a, 9b and 9c and the insulating layer 8a are provided with penetrating openings in the contact portions 11a and 11b. The formation of these openings is executed as stated below. The first gate electrode 6a, the first insulating layer 8a and the second gate electrode 7a are formed in succession. Further, an insulating layer which includes the insulating layers 9a, 9b and 9c is formed thereon. Thereafter, one layer of the insulating layer including the insulating layers 9a and 9b is photoetched in the contact portion 11a, while two layers which consist of the insulating layer including the insulating layer 8a and the insulating layer including the inslulating layer 9c are photoetched in the contact portion 11b. Thus, predetermined openings are formed by the photoetching. With this prior art technique, however, the insulating layer or layers to be etched in the contact portions 11a and 11b are different in thickness, and hence, the etched openings in the contact portions 11a and 11b become different in size. More specifically, if the etching is carried out with the intention of forming an opening of a predetermined size in the contact portion 11b, an opening larger than is required is provided in the contact portion 11a. Accordingly, a wasteful large area must be allotted to the contact portion 11a, so that the density of integration of the memory lowers.

Figure 2:
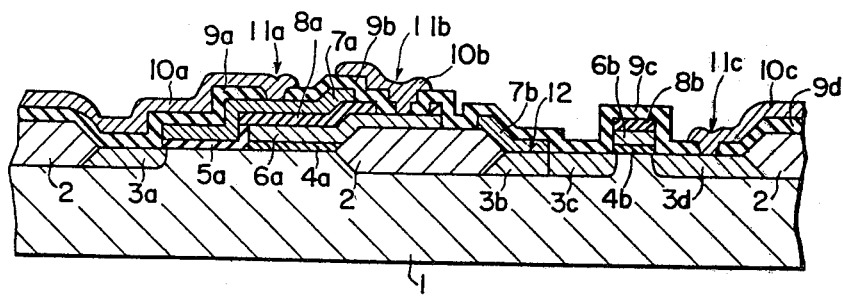
FIG. 2 is a sectional view of another semiconductor device which has been developed previously to this invention.

FIG. 2 is a sectional view of another semiconductor device which has been developed previously to this invention to overcome the problems of the prior art device described in FIG. 1.

The device shown in FIG. 2 concerns a Japanese patent application filed in Japan on July 2, 1976 by the same assignee as in the present application, laid open on Jan. 17, 1978, and having Japanese Patent Application No. 51-77827 and Japanese Patent Application Laid-open No. 53-4484. Although this device and the method of making it are now known, they were not laid open at the time when a Japanese application corresponding to the present invention disclosed herein, the present application claiming a priority based on the Japanese application, was filed in Japan.

The construction of FIG. 2 is different from that of FIG. 1 in regard to the contact portions 11a and 11b. Like reference numerals in FIGS. 1 and 2 designate like parts. After forming the gate electrodes 6a and 6b, a first insulating layer which includes the insulating layers 8a and 8b is formed thereon. The first insulating layer is processed by photoetching, to leave the illustrated portions 6a, 6b and a part lying in the contact portion 11b and to remove the other parts. Thereafter, the second gate insulating layer 5a is formed. Thereafter, the first insulating layer situated in the contact portion 11b is removed, whereupon a conductive layer for forming the second gate electrode 7a is formed over the entire area. The conductive layer is processed by photoetching so that the second gate electrode 7a and the lead-out electrode 7b may be left behind as shown in the figure. On the resultant structure, an insulating layer for forming the insulating layers 9a, 9b, 9c and 9d is formed. Subsequently, those parts of the insulating layer which correspond to the contact portions 11a, 11b and 11c are removed by photoetching.

According to the technique of FIG. 2, the thicknesses of the insulating layer to be removed for the formation of openings are equal in the contact portions 11a and 11b. Accordingly, the problem of the prior art illustrated in FIG. 1 is not involved. Furthermore, the provision of the opening in the first insulating layer in the contact portion 11b can be executed simultaneously with the step of removing an insulating layer existent on the substrate in the contact portion 12, and it increases neither the number of necessary masks nor the number of necessary steps.

In general, however, an identical conductive material, e.g., polycrystalline silicon is used for the first and second gate electrodes. Accordingly, in forming the second gate electrode 7a, the conductive layer of the same material as that of the first gate electrode 6a is stacked on this gate electrode 6a in the contact portion 11b, and in etching the stacked two layers, the etching must be controlled so as to establish the thickness of the original one layer. It is generally very difficult to precisely control such an etching depth. Therefore, the first gate electrode 6a is unnecessarily etched when the second gate electrode 7a is formed. In consequence, the contact between the interconnection conductor 10b and the first gate electrode 6a in the contact portion 11b becomes inferior. This inferior contact lowers the yield of fabrication or degradation in the performance of the semiconductor device.

As thus far described, both of the prior art devices and techniques have the problems of the lowering the density of integration, lowering the yield of fabrication, and degrading the performance of the semiconductor device.

DETAILED DESCRIPTION OF THE PREFERRED EMBODIMENTS

In the following description, the manufacturing process of this invention will be explained as employing a P-type silicon substrate as a semiconductor substrate, employing an N-type impurity as a diffusing impurity or dopant, and conforming with the N-channel FET technique. Of course, this invention can also be performed by the use of an N-type semiconductor substrate and a P-type diffusant or dopant. In general, accordingly, both the cases are expressed with the terms of the first conductivity type and the second conductivity type.

Figure 3A:
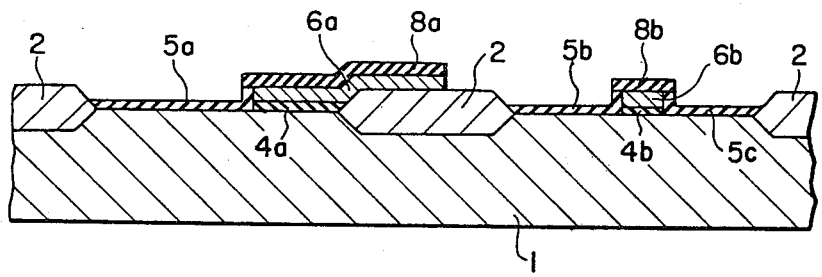
FIGS. 3A to 3C are sectional views of a semiconductor device according to this invention in the course of a manufacturing process according to this invention.

FIG. 3A shows a structural body in the course of the manufacturing process of this invention. The structural body is fabricated as follows:

(1) A P-type silicon substrate 1 in which boron is used as a P-type dopant is prepared.

(2) A plurality of oxide field isolating regions 2 are formed on the P-type silicon substrate 1. To this end, the known LOCOS (local oxidation of silicon) technique is adopted. In this technique, silicon nitride ($Si_3N_4$) is chemically evaporated on the surface of the P-type silicon substrate 1, the silicon nitride in the regions in which a field oxide is to be formed is removed by the photoetching technique, and the resultant substrate is thermally oxidized at about 1,000° C. in a wet oxygen atmospere. After the field isolating regions 2 have thus been formed, the remaining silicon nitride is removed.

(3) Subsequently, a first insulating layer for forming first and third gate insulating layers 4a and 4b is formed over the entire area of the silicon substrate 1. The first insulating layer is formed by the growth or deposition on the silicon substrate 1. It has a thickness of about 200–1,000 Å, and can be made of, for example, silicon dioxide ($SiO_2$). The silicon dioxide is grown by holding the silicon substrate 1 in a dry oxygen atmosphere and thermally oxidizing the silicon substrate surface at 1,000° C.

(4) A first conductive layer for forming first and third gate electrodes 6a and 6b is formed over the entire area of the first insulating layer. This first conductive layer has a thickness of about 1,500–5,000 Å, and is constructed of, for example, a polycrystalline silicon layer. More specifically, after forming polycrystalline silicon layer by the chemical vapor deposition, it is doped with an N-type impurity such as arsenic, phosphorus or antimony (phosphorus is desirable) by a conventional technique. Further, using the technique of doping a phosphoryl chloride ($POCl_3$), the polycrystalline silicon layer is doped with phosphorus by diffusion. In order to render this layer the N-type conductivity, it is heated to about 870° C. Thereafter, phosphoryl chloride ($POCl_3$) remaining on the surface is removed by photoetching in a buffered hydrofluoric acid solution.

(5) A second insulating layer for forming first and third inter-layer insulating layers 8a and 8b is formed on the first conductive layer. The second insulating layer may be a phosphorus silicate glass layer, a silicon dioxide ($SiO_2$) layer, a silicon nitride ($Si_3N_4$) layer, or an aluminum oxide ($Al_2O_3$) layer. By way of example, the phosphorus silicate glass layer is formed to a thickness of about 500–5,000 Å by the chemical vapor deposition in a mixed gas atmosphere of nitrogen, oxygen, phosphine ($PH_3$) and silane ($SiH_4$). On the other hand, the silicon dioxide layer is formed to a thickness of 500–5,000 Å in such a way that, after the first conductive layer has been formed of polycrystalline silicon in accordance with the step (4), the polycrystalline silicon is thermally oxidized. The method of this thermal oxidation is the same as in the step (3).

(6) The first insulating layer, the first conductive layer, and the second insulating layer are removed so as to leave the first and third gate insulating layers 4a and 4b, the first and third gate electrodes 6a and 6b, and the first and third inter-layer insulating layers 8a and 8b, respectively. More specifically, a structural body formed by the step (5) is coated with photoresist over the entire surface and is exposed to light through a predetermined mask. Thereafter, the first insulating layer except the first and third inter-layer insulating layers 8a and 8b is etched and removed in a buffered hydrofluoric acid solution. Subsequently, the resultant structure is subjected to etching in a mixed solution consisting of hydrofluoric acid and nitric acid or in a plasma of freon ($CF_4$) gas atmosphere. At this time, the inter-layer insulating layers 8a and 8b function as masks, so that the first and third gate electrodes 6a and 6b in the first conductive layer are left behind, the other part of the conductive layer being removed. The resultant structure is subjected to etching in a buffered hydrofluoric acid solution. At this time, the inter-layer insulating layers 8a and 8b again function as masks, so that the first and third gate insulating layers 4a and 4b remain without being etched. The other part of the insulating layer is removed.

(7) Subsequently, a third insulating layer including parts 5a, 5b and 5c is formed on those parts of the semiconductor surface which are not covered with the first and third gate insulating layers 4a and 4b.

The third insulating layer is formed of silicon dioxide about 200–1,000 Å thick as is obtained by thermally oxidizing the semiconductor substrate by the same technique as that for the first gate insulating layer. At this time, silicon dioxide formed by the oxidation of the first and third gate electrodes 6a and 6b is also deposited on the side surfaces of the gate electrodes.

Figure 3B:
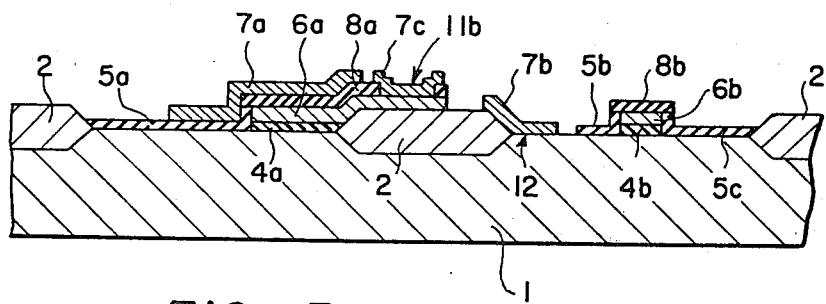

Thus the structural body shown in FIG. 3A is formed. A structural body as shown in FIG. 3B is obtained by subjecting the structure in FIG. 3A to processing of the following steps:

(8) That part of the first inter-layer insulating layer 8a which corresponds to a contact portion 11b for the first gate electrode 6a, and that part of the third insulating layer part 5b which corresponds to a source electrode lead-out portion 12 are removed.

While the removal of these two parts can be executed by separate steps, it is possible to use one step. More specifically, the surface of the structure in FIG. 3A is coated with photoresist, and according to the photoetching technique, the first inter-layer insulating layer 8a and the third insulating layer are etched and removed at the parts corresponding to the contact portion 11b and the source (or drain) lead-out portion 12 of an FET. In the contact portion 11b, a first opening for contact is provided in a manner to penetrate the first inter-layer insulating layer 8a. A buffered hydrofluoric acid solution may be used as the etchant for this purpose.

(9) A second conductive layer is formed over the entire surface of the structure formed by the step (8). The second conductive layer can be formed similarly to the first conductive layer and of, for example, doped polycrystalline silicon. As the result, a part of the second conductive layer is buried in the first opening and is connected with the first gate electrode 6a.

(10) That part of the second conductive layer which is other than a part of a second gate electrode 7a, a part of a source (or drain) lead-out electrode 7b of the peripheral FET and a part 7c inserted in the first opening in the contact portion 11b is removed by the photoetching technique. In this case, a solution similar to that for the etching of the first gate electrode 6a in the step (6) is used as an etchant. The part 7c partially overlies the first inter-layer insulating layer 8a, and is partially buried within the first opening and connected to the first gate electrode 6a.

Thus, the structural body in FIG. 3B is obtained.

It is an important feature of this invention to form the part 7c buried in the first opening. This part 7c is a subsidiary interconnection conductive layer for connecting an interconnection conductor to the first gate electrode 6a.

As apparent from the process described above, the subsidiary interconnection conductive layer 7c can be formed of the same material as that of the second gate electrode 7a, for example, doped polycrystalline silicon and at the same time as the formation of the second gate electrode 7a. Of course, the part 7c can also be formed by the use of a step and a material different from those for the second gate electrode 7a, but the simultaneous formation with the same material is advantageous in that neither the number of photomasks to be used nor the number of steps for manufacture is increased. Furthermore, since the subsidiary interconnection conductive layer 7c can be formed of the same material as that of the first gate electrode 6a, both can be perfectly connected.

Figure 3C:
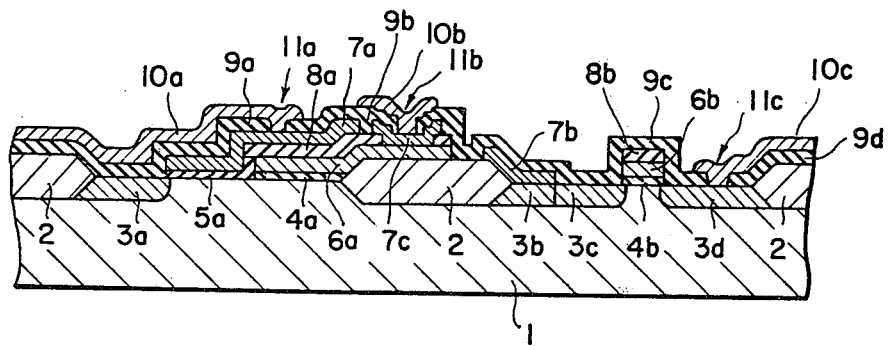

The structure of FIG. 3B is next subjected to processing to be stated below, to form a structural body as shown in FIG. 3C.

(11) Impurity diffused layers 3a, 3b, 3c, and 3d which are to become sources or drains are formed under the semiconductor substrate surface in the vicinity of the second gate electrode 7a and in the vicinity of the third gate electrode 6b.

To this end, the structure of FIG. 3B is put into a buffered hydrofluoric acid solution, to etch and remove exposed part of the third insulating layer.

Thereafter, an N-type impurity such as phosphorus is diffused from the exposed silicon surface by the thermal diffusion technique, to form the impurity diffused layers 3a, 3c and 3d. At this time, the N-type impurity contained in the source (or drain) electrode lead-out portion 7b is thermally diffused into the silicon substrate 1 underlying the source (or drain) electrode lead-out portion 7b. Consequently, the impurity diffused region 3b is also formed underneath the source (or drain) electrode lead-out portion 7b. It becomes integral with the diffused layer 3c around the third gate electrode 6b of the peripheral FET, so that a continuous impurity-diffused region is formed. The integral impurity-diffused regions at 3b and 3c functions as the source (or drain) of the FET, and the impurity diffused layer 3d functions as the drain (or source) thereof.

Further, the impurity diffused layer 3a which is formed in the vicinity of the surface of the silicon substrate 1 between the oxide field isolating region 2 and the second gate electrode 7a in the memory cell portion by this thermal diffusion process functions as the source (or drain) of a field-effect switching element.

Although, in the above step, the thermal diffusion technique has been employed for forming the diffused layers 3a, 3b, 3c, and 3d, it is also possible to adopt the ion implantation technique. More specifically, an N-type impurity such as phosphorus is ion-implanted into the surface of the structure shown in FIG. 3B. As the result, the impurity is implanted into those areas of the surface of the semiconductor substrate 1 which are not covered with the first, second and third gate electrodes 6a, 7a and 6b, the source (or drain) lead-out electrode 7b, and the field isolating regions 2. In the semiconductor surface portions covered with the insulating layers 5a, 5b and 5c, the N-type impurity is also implanted through these insulating layers. Thereafter, annealing is carried out to form the impurity diffused layers 3a, 3c and 3d. In the annealing, the impurity diffused layer 3b is also formed underneath the source (or drain) lead-out electrode 7b for the same reason as previously described on the case of employing the thermal diffusion technique.

(12) A fourth insulating layer is formed on the structure obtained by the step (11). This insulating layer is formed of phosphorus silicate glass to a thickness of 500–5,000 Å by the method explained in the step (5).

(13) The fourth insulating layer is formed with second, third and fourth penetrating openings in contact portions 11a, 11b and 11c, respectively, to leave insulating layers 9a, 9b, 9c, and 9d behind. To this end, the known photoetching technique employing a buffered hydrofluoric acid solution is used.

(14) Interconnection conductors 10a, 10b and 10c are formed. A conductive material, for example aluminum, is buried into the second, third and fourth openings by evaporation so as to connect it with the conductive layers underlying the fourth insulating layer.

The interconnection conductor 10a is connected with the second gate electrode 7a through the second opening provided in the contact portion 11a.

The interconnection conductor 10b is connected with the interconnection subsidiary conductive layer 7c through the third opening provided in the contact portion 11b. The conductive layer 7c is connected to the first gate electrode 6a.

The interconnection conductor 10c is connected with the impurity diffused layer 3d in the drain (or source) portion of the peripheral FET through the fourth opening provided in the contact portion 11c.

That part of the insulating layers 9a and 9b which is disposed on the second gate electrode 7a forms a second inter-layer insulating layer for isolating the interconnection conductor 10a from the second gate electrode 7a except at the second opening.

That part of the insulating layer 9b which is disposed on the subsidiary interconnection conductive layer 7c forms a third inter-layer insulating layer for isolating the interconnection conductor 10b from the subsidiary interconnection conductive layer 7c except at the third opening.

That part of the insulating layers 9c and 9d which is disposed on the impurity diffused region 3d forms a fourth inter-layer insulating layer for isolating the interconnection conductor 10c from the impurity diffused region 3d except at the fourth opening.

In this way, the semiconductor device of this invention illustrated in FIG. 3C is fabricated.

In the construction described above, the size of the third opening formed in the second inter-layer insulating layer and situated in the contact portion 11b should preferably be made smaller than the size of the upper surface of the subsidiary interconnection conductive layer 7c so that the interconnection conductor 10b may be connected to a part of the upper surface of the interconnection subsidiary conductive layer 7c.

According to this invention as set forth above, in the contact portion 11b, the subsidiary interconnection conductive layer 7c is interposed between the first gate electrode 6a and the second interconnection conductor 10b. Therefore, the invention overcome the problem of the prior art device shown in FIG. 2 that the surface of the first gate electrode 6a is simultaneously removed during the step of photoetching the second gate electrode 7a.

Further, the identical fourth insulating layer may be processed in the respective contact portions 11a, 11b and 11c. Therefore, the problem of the prior art device shown in FIG. 1 that the processed sizes of the openings become different does not occur. Since the second insulating layer is removed in the contact portion 11b in advance, the shape of the contact portion does not differ from those of the other contact portions even when insulators of different properties, for example, phosphorus silicate glass films of different concentrations of phosphorus, or quite different insulating layers, for example, a silicon nitride layer and a phosphorus silicate glass layer, are used for the second insulating layer and the third insulating layer.

The present invention is not limited to the above embodiments and includes variations within the scope of the claims described below.

For example, although in the above described embodiment the third gate electrode 6b is formed in the same step and with the same conductive material as those for the first gate electrode 6a, it is also effective to form the third gate electrode 6b in the same step and the same conductive layer as those for the second gate electrode 7a.

Furthermore, the third insulating layer including those parts 5a, 5b, 5c can be formed in the same step and with the same insulating material as those for the first and second inter-layer insulating layers 8a and 8b.

In the foregoing embodiment, the semiconductor integrated circuits which have the gate electrodes with a two-level structure has been taken as an example. However, this invention is not restricted thereto, but it is similarly applicable to a case where the number of layers of the gate electrode is further increased.

What is claimed is:

1. A process for making a multi-level electrode structure for a semiconductor device formed in a surface region of a single semiconductor substrate, comprising steps of:
forming a first conductive layer above a first part of the surface region of said substrate;
forming a first insulating layer on said first conductive layer;
forming a first opening in a first part of said first insulating layer;
forming a second conductive layer so that a first part of said second conductive layer overlies a second part of the surface region of said substrate and a second part of said first insulating layer, and so that a second part of said second conductive layer overlies a third part of said first insulating layer which is between said first and second parts of said first insulating layer, and so that a third part of said second conductive layer is connected with said first conductive layer;
removing said second part of said second conductive layer so that said third part of said second conductive layer is isolated from said first part of said second conductive layer;
forming a second insulating layer so that first and second parts of said second insulating layer respectively overlie said first and third parts of said second conductive layer;
forming second and third openings simultaneously in said first and second parts of said second insulating layer; and
filling said second and third openings simultaneously, respectively, with first and second conductors so that said first and second conductors are connected with said first and third parts of said second conductive layer, respectively.

2. A process for making a multi-level electrode structure for a semiconductor device as defined in claim 1, wherein said first conductive layer is formed to be a gate electrode of a field effect capacitor and said first part of said second conductive layer is formed to be a gate electrode of a field effect switching element, which field effect switching element is adapted to control charge transfer to said field effect capacitor.

3. A process for making a multi-level electrode structure for a semiconductor device as defined in claim 1, wherein said second conductive layer is made of doped polycrystalline silicon.

4. A process for making a multi-level electrode structure for a semiconductor device as defined in claim 1, 2 or 3, wherein said first conductive layer is made of doped polycrystalline silicon.

5. A process for making a multi-level electrode structure for a semiconductor device as defined in claim 1, wherein the second and third openings are filled simultaneously and wherein the first and second conductors are of the same conductive material.

6. A process for making a multi-level electrode structure for a semiconductor device formed in the surface region of a semiconductor substrate comprising:
(a) forming a first electrode which is disposed above a semiconductor substrate surface, and then forming a first insulating layer which is disposed on said first electrode and which has a first opening penetrating a part of said first insulating layer;
(b) forming a second electrode which is made of a second conductive layer disposed above said substrate surface, at least a part of said second electrode overlying said first insulating layer at a position other than said first opening;
(c) forming a subsidiary conductive layer disposed in said first opening, connected with said first electrode, and electrically isolated from said second electrode;
(d) forming a second insulating layer disposed on both said second electrode and on said subsidiary conductive layer;
(e) forming second and third openings simultaneously through the second insulating layer at respective predetermined positions above the second electrode and the subsidiary conductive layer;
(f) forming a first conductor disposed in said second opening and connected with said second electrode; and
(g) forming a second conductor disposed in said third opening and connected with said subsidiary conductive layer, said second conductor forming an interconnection for said first electrode.

7. A process for making a multi-level electrode structure for a semiconductor device as defined in claim 6, wherein the first and second interconnection conductors are formed simultaneously and are formed of the same conductive material.

8. A process for making a multi-level electrode structure for a semiconductor device as defined in claim 6 further comprising the steps of:
forming a field oxide isolating region in said semiconductor substrate to divide said substrate surface into at least a first region above which said first and second electrodes are formed and a second region comprising a third part of said substrate surface;

forming a third insulating layer on said third part of said substrate surface;

forming a third electrode which is made of a conductive layer, said third electrode being formed on said third insulating layer; and forming a lead-out electrode, adapted to be connected with a source or drain region in a surface region of said semiconductor substrate, on a fourth part of said substrate surface, in said second region, said lead-out being formed simultaneously with and of the same conductive material as said subsidiary conductive layer.

9. A process for making a multi-level electrode structure for a semiconductor device as defined in claim 8, wherein said third electrode, said second electrode and said subsidiary conductive layer are formed simultaneously and of the same conductive material.

10. A process for making a multi-level electrode structure for a semiconductor device as defined in claim 8, wherein said third electrode and said first electrode are formed simultaneously and of the same conductive material.

11. A process for making a multi-level electrode structure for a semiconductor device as defined in claim 6, wherein said first electrode and said subsidiary conductive layer are made of the same conductive material.

12. A process for making a multi-level electrode structure for a semiconductor device as defined in claim 11, wherein said second electrode and said subsidiary conductive layer are made of the same conductive material and are formed simultaneously.

13. A process for making a multi-level electrode structure for a semiconductor device as defined in claim 6 comprising the further steps of forming a first gate insulating layer on said semiconductor substrate between said first electrode and said substrate surface, and forming a second gate insulating layer between a first part of said second electrode and said semiconductor substrate surface, wherein said first electrode is a first gate electrode and is formed in parallel with a surface of said semiconductor substrate, and wherein said second electrode is a second gate electrode, said first part thereof being formed to overlie said substrate and to adjoin said first gate electrode and a second part thereof being formed on a part of said first gate electrode.

14. A process for making a multi-level electrode structure for a semiconductor device as defined in claim 13, wherein said second electrode and said subsidiary conductive layer are made of the same conductive material and are formed simultaneously.

15. A process for making a multi-level electrode structure for a semiconductor device as defined in claim 14, wherein said same conductive material is doped polycrystalline silicon.

16. A process for making a multi-level electrode structure for a semiconductor device as defined in claim 15, wherein said first electrode and said subsidiary conductive layer are made of the same conductive material.

17. A process for making a multi-level electrode structure for a semiconductor device as defined in claim 16, wherein said same conductive material is doped polycrystalline silicon.

18. A process for making a multi-level electrode structure for a semiconductor device as defined in claim 12 or 14, wherein the second electrode and the subsidiary conductive layer are formed simultaneously by the steps of:

forming a conductive layer so that a first part of said conductive layer overlies said substrate surface and a second part of said first insulating layer different from the part of the first insulating layer having said first opening therethrough, so that a second part of said conductive layer overlies a third part of said first insulating layer which is located between said second part of said first insulating layer and said part of the first insulating layer having said first opening therethrough, and so that a third part of said conductive layer is inserted in said first opening; and removing said second part of said conductive layer so that said first part of said conductive layer forms said second electrode and said third part of said conductive layer forms said subsidiary conductive layer.

19. A process for making a multi-level electrode structure for a semiconductor device as defined in claim 12 or 18, wherein said subsidiary conductive layer and said second conductor are formed of different conductive materials.

20. A process for making a multi-level electrode structure for a semiconductor device as defined in claim 12 or 18, wherein said second conductor is connected with a part of an upper surface of said subsidiary conductive layer.

21. A process for making a multi-level electrode structure for a semiconductor device as defined in claim 20, wherein said third opening is smaller than the upper surface area of said subsidiary conductive layer so that only a part of said upper surface area is exposed by said third opening, said exposed part of said upper surface area being that which is connected with said second conductor which is disposed in said third opening.

22. A process for making a semiconductor device having at least two semiconductor circuit elements formed on a single semiconductor substrate, comprising:

(a) a step of forming a first conductivity type semiconductor substrate which contains a first conductivity type active impurity;

(b) a step of forming a first field-effect circuit element in the surface region of said semiconductor substrate, said step including forming a first gate insulating layer on a first part of the surface region of said substrate, forming a first gate electrode made of a first conductive layer on said first gate insulating layer, and forming a first inter-layer insulating layer on said first gate electrode;

(c) a step of providing a first penetrant opening in a first part of said first inter-layer insulating layer;

(d) a step of forming a second field-effect circuit element in the surface region of said semiconductor substrate and forming a subsidiary conductive layer in said first opening in a manner whereby said subsidiary conductive layer is connected with said first electrode and is isolated from said second electrode, said step including forming a second gate insulating layer on a second part of the surface region of said substrate, and then forming simultaneously and of the same material said subsidiary conductive layer inserted into said first opening and a second gate electrode made of a second conductive material so that the first part of said second gate electrode overlies said second gate insulating layer and a second part of said second gate electrode overlies a second part of said first inter-layer insulating layer different from said first part of said first inter-layer insulating layer, said forming simultaneously and of the same material the subsidiary conductive layer and the second gate electrode comprising (d1) forming a conductive layer so that a first part of said conductive layer overlies said second gate insulating layer and said second part of said first inter-layer insulating layer, and so that a second part of said conductive layer overlies a third part of said first inter-layer insulating layer which is located between said first and second parts of said first inter-layer insulating layer, and so that a third part of said conductive layer is inserted in said first opening; and (d2) removing said second part of said conductive layer so that said first part of said conductive layer forms said second gate electrode and said third part of said conductive layer forms said subsidiary conductive layer;

(e) a step of forming a second inter-layer insulating layer on said second gate electrode and on said subsidiary conductive layer;

(f) a step of forming second and third openings in said second inter-layer insulating layer simultaneously, said second and third openings respectively overlying said second gate electrode and said subsidiary conductive layer;

(g) a step of filling said second opening with a first conductor in a manner to be connected with said second gate electrode; and (h) a step of filling said third opening with a second conductor in a manner to be connected with said subsidiary conductive layer.

23. A process for making a semiconductor device as defined in claim 22, wherein said first and second conductors are formed simultaneously and are the same conductive material.

24. A process for making a semiconductor device as defined in claim 23, wherein said second gate electrode and said subsidiary conductive layer are formed of doped polycrystalline silicon.

25. A process for making a semiconductor device as defined in claim 23, wherein said first and second gate electrodes and said subsidiary conductive layer are formed of doped polycrystalline silicon.

* * * * *